United States Patent [19]

Yokogawa

[11] 4,232,395
[45] Nov. 4, 1980

[54] MULTIBAND RADIO RECEIVER WITH ELECTRONIC PRESET TUNING SYSTEM

[75] Inventor: Tomohisa Yokogawa, Kawagoe, Japan

[73] Assignee: Pioneer Electronic Corporation, Tokyo, Japan

[21] Appl. No.: 917,227

[22] Filed: Jun. 20, 1978

[30] Foreign Application Priority Data

Jun. 20, 1977 [JP] Japan .................................. 52/73120

[51] Int. Cl.³ .............................................. H04B 1/16
[52] U.S. Cl. ................................... 455/173; 455/175; 455/176; 455/186
[58] Field of Search ............... 325/420, 421, 457, 458, 325/464, 418, 459; 455/175, 176, 173, 180, 182, 186, 197

[56] References Cited

U.S. PATENT DOCUMENTS

| | | | |
|---|---|---|---|
| 3,166,714 | 1/1965 | Vo Dinh Hien ...................... | 325/457 |
| 3,207,989 | 9/1965 | Cooke et al. .......................... | 325/420 |
| 4,079,320 | 3/1978 | Mogi ..................................... | 325/420 |
| 4,085,372 | 4/1978 | Mogi et al. ........................... | 325/464 |

*Primary Examiner*—Jin F. Ng
*Attorney, Agent, or Firm*—Sughrue, Rothwell, Mion, Zinn and Macpeak

[57] ABSTRACT

A multiband radio receiver having an electronic preset tuning system is provided with a switch which is ganged with a preset switch in the electronic preset tuning system, so that an automatic frequency control is interrupted from a local oscillator in preset operation. During preset operation, no automatic frequency control is provided, as a result of which fine-tuning can be accomplished to memorize a digital signal representative of a completely tuned frequency in a read-write memory.

2 Claims, 1 Drawing Figure

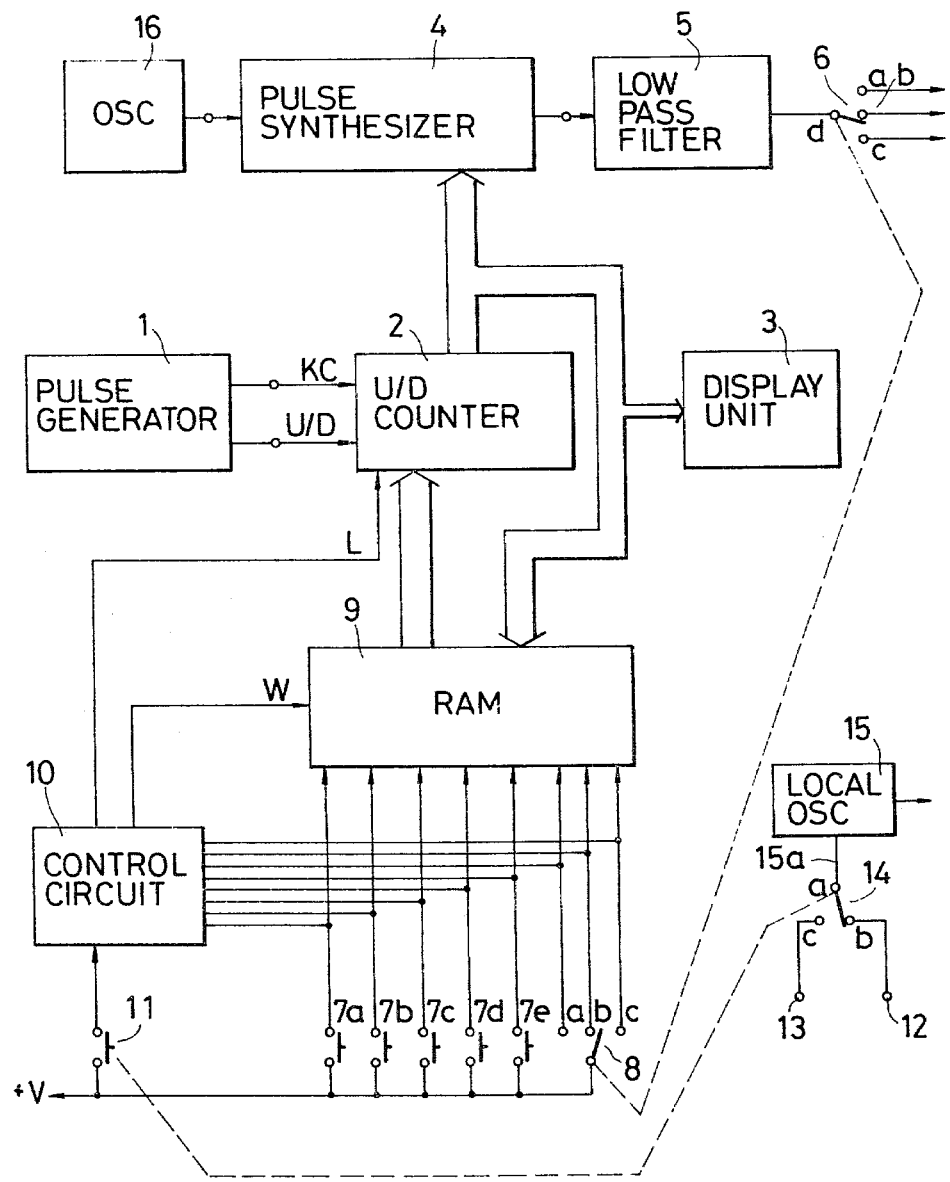

4,232,395

MULTIBAND RADIO RECEIVER WITH ELECTRONIC PRESET TUNING SYSTEM

BACKGROUND OF THE INVENTION

This invention relates to a multiband radio receiver with an electronic preset tuning system, and more particularly to a multiband radio receiver in which a station to be received can be preset accurately.

Recently, due to the rapid progress of electronic engineering, a variety of radio receivers, in which a band and a channel of a station to be received can be preset, have been proposed. For example, a digitally controlled preset radio receiver was disclosed in applicant's Japanese Utility Model Application No. 11353/1975. In the above conventional radio receiver, the channel preset system comprises a preset switch; a channel selecting switch; a pulse generator for selectively generating up pulses and down pulses; an UP/DOWN counter connected to the pulse generator; a digital display means for displaying a frequency value in response to the digital output signal of the U/D counter; a digital-to-analog convertor connected to the U/D counter to convert the digital output signal thereof into an analog signal, the analog signal being applied to variable capacitance diodes (varactor diodes) in a tuning circuit; a memory means such as a random access memory (RAM) for memorizing the output of the U/D counter and providing outputs as to the data addressed therein to the U/D counter; and a control circuit for controlling write and read-out operation of the RAM. The channel selecting switches described above are, for instance, non-lock type selecting switches, while the band selecting switch is a rotary switch. Whenever a channel selecting signal outputted by each channel selecting switch and a band selecting signal outputted by the band selecting switch are detected, the output of the memory is inputted into the U/D counter so as to carry out the necessary control operation.

In this case, however, the radio receiver as described above is disadvantageous in the following points; that is, since an automatic frequency control (AFC) circuit is operated during the preset operation of a station being received, it is impossible to determine whether a preset frequency value is accurately tuned in. Accordingly, there is a possibility that an inaccurate frequency value is preset. As a result, in the case when preset station selection is carried out in accordance with the preset frequency value, it may be impossible to accurately achieve the preset station selection.

SUMMARY OF THE INVENTION

Accordingly, an object of the present invention is to provide a multiband receiver with an electronic preset tuning system in which a station being received can be preset accurately.

The foregoing object is achieved by interrupting a connection between an AFC circuit and a local oscillator to prevent AFC operator during manual station selection and by supplying a reference biasing signal to the local oscillator to obtain accurate manual tuning of a desired frequency in the preset operation. By contrast, the preset station selection is carried out while the AFC circuit is connected to the local oscillator, thereby eliminating frequency drift.

BRIEF DESCRIPTION OF THE DRAWING

In the accompanying drawing, the single FIGURE is a block diagram illustrating one example of the electronic preset tuning system according to the present invention.

DETAILED DESCRIPTION OF THE PREFERRED EMBODIMENT

In FIG. 1 which is a block diagram showing essential components of an electronic preset tuning system according to the present invention, a pulse generator 1 has a pair of output terminals from which a series of either up pulses U or down pulses D and clock pulses KC are selectively generated by manual operation. The output terminals of the pulse generator 1 are connected to a binary UP/DOWN counter 2 which employs the up/down pulses U/D outputted from the pulse generator 1 as a count control signal to count the clock pulse KC applied thereto. An output of the U/D counter 2 is fed to a digital frequency display unit 3. The display unit 3 employs a few most significant bits of the count output of the U/D counter 2 as its input to carry out digital display of the selected frequency. The output of the U/D counter 2 is also fed to an input of a pulse synthesizer 4 in which output signals obtained by subjecting an oscillation signal to successive frequency divisions are selected and synthesized with the output signal of the U/D counter 2, to thereby obtain a serial pulse train having the number of pulses which corresponds to the output of the U/D counter 2. Such a pulse synthesizer is described in U.S. Pat. No. 3,603,977. An output of the pulse synthesizer 4 is fed to a low pass filter which constitutes a digital-to-anolog (D-A) convertor together with the pulse synthesizer 4 and an oscillator 16. A band selecting switch 6 operates to selectively supply the D.C. output of the low pass filter 5 to a tuning circuit (not shown) to thereby select a desired band, and has stationary contacts a through c corresponding to bands A through C, respectively. There is provided another band selecting switch 8 having stationary contacts a through c corresponding to bands A through C, which operates in association with the aforementioned band selecting switch 6. A channel selecting switch 7 comprises a plurality of non-lock type switches 7a through 7e and one side of each of the channel switches 7 are commonly connected. A random access read-write memory (RAM) 9 has a plurality of inputs connected to the output sides of the channel selecting switches 7a through 7e and the stationary contacts a through c of the band selecting switch 8, respectively, in order to memorize the output of the U/D counter 2 at an address assigned by the indications of the channel selecting switches 7a through 7e and the band selecting switches 8, or to read-out the data memorized at an assigned address to supply it to the U/D counter 2. A control circuit 10 has an input connected to one side of a preset switch 11 the other side of which is connected to a common connection line of the channel selecting switches 7a through 7e and the band selecting switch 8. The control circuit 10 also has inputs connected to respective output sides of the channel selecting switches 7a through 7e and the band selecting switch 8. When the preset switch 11 is in an "off" state and any one output from the channel selecting switches 7a through 7e and any one output from the band selecting switch 8 are provided, the control circuit 10 supplies a load signal L to the U/D counter 2. However case when the preset switch 11 is in an "on" state, it supplies a write signal W to the random access read-write memory 9. An output of an AFC circuit is fed to an input terminal 12, while a reference biasing signal is fed to an input terminal 13 for obtaining an accurate tuning in preset operation. A switch 14 which is operated in association with the preset switch 11 is provided for selectively supplying an AFC signal from the terminal 12 and a reference biasing signal from the terminal 13 to a local oscillator 15 in the radio receiver. The switch 14 has a movable contact a and stationary contacts b and c which are connected to the input terminals 12 and 13, respectively. The movable contact a normally contacts with the stationary contact b so as to supply the AFC signal to the local oscillator 15, thereby eliminating frequency drift. In the case when the preset switch 11 is operated, the movable contact a is switched to contact with the stationary contact c so as to supply the reference biasing signal to the local oscillator 15.

In the above described radio receiver with the electronic preset tuning system, if the pulse generator 1 is operated, that is, if the knob of the pulse generator 1 is rotated to generate an up pulse U, for instance, and a clock pulse, the up pulse U and clock pulse KC are supplied to the U/D counter 2, and accordingly this causes the U/D counter 2 to up-count the clock pulse KC successively. The parallel count outputs of the U/D counter 2 are applied to the pulse synthesizer 4, where the signals obtained by subjecting the oscillation signal produced by the oscillator 16 to successive frequency division, are selectively combined with the output of the U/D counter 2 into a serial pulse train having a number of pulses corresponding to the output of the U/D counter 2 in the manner described above. The thus obtained output of the synthesizer 4 is fed to a low pass filter 5 to remove a high frequency component, as a result of which a D.C. voltage signal corresponding to the output of the U/D counter 2 can be obtained. This D.C. voltage signal is applied to varactor diodes included in a tuning circuit (not shown) which is selected by an operation of the band selecting switch 6 so that the corresponding frequency tuning in that band is carried out. On the other hand, an AFC signal which is applied to the input terminal 12, is fed through the switch 14 to the local oscillator 15 to thereby achieve an automatic frequency control. Furthermore, the most significant bits of the output of the U/D counter 2 are applied to the digital frequency display unit 3, where the frequency being received is digitally displayed. Disclosed above is the electronic tuning operation in the case where a station is manually selected.

In preset operation, under an assumption that a desired channel in a desired band has been selected in the manual manner described above, the preset switch 11 is turned-on, and then one of the channel selecting switches 7a through 7e corresponding to a channel to be preset is turned-on. As a result, the write signal W is applied from the control circuit 10 to the random access read-write memory 9, so that the count output of the U/D counter 2, that is, a digital signal representative of the tuned frequency can be memorized at an address which is assigned by the band selecting switch 8 of the read-write memory 9 and the channel selecting switches 7a through 7e that have been turned-on. Similarly, as in the above described case, it is possible to preset desired frequencies for the other channels. In this case, when the preset switch 11 operates to close, the switch 14 which operates in association with the preset switch 11, is switched to contact with the input terminal c. Accordingly, the reference biasing signal is supplied to the local oscillator 15. As a result, in the tuning circuit, a tuning against the corresponding frequency is accurately carried out with reference to the reference biasing signal. In addition, assuming that the tuning is inaccurate, an accurate tuning can be obtained by manual tuning operation. Thus, when the preset switch 11 is operated for preset operation, since a tuning against the corresponding frequency is carried out with reference to the reference biasing signal, under this condition, it is possible to achieve a fine-tuning in order to obtain complete tuning. As a result, a digital signal representative of the completely tuned frequency can be memorized at an address which is assigned by the band selecting switch 8 and any one of the channel selecting switches which have been turned on.

When carrying out the preset station selection, an address where a digital signal corresponding to a desired station is memorized is selected by selectively operating the band selecting switch 8 and the channel selecting switches 7a through 7e. In this case, since the preset switch 11 is normally in an "off" state, the load signal L is supplied from the control circuit 10 to the U/D counter 2. As a result, the read-write memory 9 reads, as an address, the outputs of the band selecting switch 8 and any one of the channel selecting switches 7a through 7e which have been turned on. The stored signal of the read-write memory 9 is inputted, in a parallel mode, into the U/D counter 2. The output of the U/D counter 2 is applied to the pulse synthesizer 4, whereafter the station selecting operation identical to that in the manual operation is carried out. Thereafter, the preset station selection in the same band can be changed merely by selectively turning on the channel selecting switches 7a through 7e. In addition, in the case where the band should be changed, the preset station selection is carried out by switching the band selecting switch 8 and then selectively turning on the channel selecting switches 7a through 7e.

As is apparent from the above description, the local oscillator in the multiband radio receiver is normally controlled by the automatic frequency control (AFC) to eliminate frequency drift, while in case of memorizing a digital signal corresponding to a desired station in the read-write memory, an input signal to the local oscillator is changed from the AFC signal to a reference biasing signal to thereby carry out a fine-tuning. Therefore, according to the present invention, a digital signal representative of a completely tuned frequency can be memorized in the read-write memory.

What is claimed is:

1. In a multiband radio receiver having an automatic frequency control signal source, a local oscillator, a reference biasing signal source and a digitally controlled preset tuning system which stores digital values corresponding to preset frequencies in response to the operation of a preset switch, the improvement characterized by an AFC switch normally operating to supply the output of said automatic frequency control signal source to said local oscillator, said AFC switch ganged with said preset switch such that when said preset switch is operated, said AFC switch is switched to supply the output of the said reference biasing signal source to said local oscillator, whereby when said preset switch is operated, said local oscillator provides a signal to said radio receiver under the control of said reference bias potential and at all other times provides a signal to said radio receiver under the control of said automatic frequency control signal source.

2. A multiband radio receiver as defined in claim 1, wherein said preset tuning system comprises an up/down counter whose up/down count is controlled by manual operation; a digital-to-analog convertor operating to convert the digital count output of said up/down counter into analog signal which is applied, as a tuning voltage, to variable capacitance diodes in a tuning section; a read-write memory which is addressed by a band selecting switch and channel selecting switches to memorize the digital count output of said up/down counter and to deliver read-out information to said up/down counter; and a control circuit having inputs connected to said preset switch, said band selecting switch and said channel selecting switches, respectively, a load output connected to said up/down counter and a write output connected to said read-write memory, said control circuit responsive to the information from said preset switch, said band selecting switch and any one of said channel selecting switches to supply a write signal to said read-write memory for memorizing the content of said up/down counter and responsive to the information from said band selecting switch and any one of said channel selecting switches to supply a load signal to said up/down counter for reading out the content of said read-write memory.

* * * * *